United States Patent [19]

Taylor et al.

[11] Patent Number: 5,550,007
[45] Date of Patent: Aug. 27, 1996

[54] SURFACE-IMAGING TECHNIQUE FOR LITHOGRAPHIC PROCESSES FOR DEVICE FABRICATION

[75] Inventors: Gary N. Taylor, Bridgewater, N.J.; David R. Wheeler, Albuquerque, N.M.

[73] Assignee: Lucent Technologies Inc., Murray Hill, N.J.

[21] Appl. No.: 68,485

[22] Filed: May 28, 1993

[51] Int. Cl.$^6$ ........................................... G03F 7/26
[52] U.S. Cl. .................... 430/314; 430/315; 430/317; 430/324; 156/628.1; 156/643.1; 156/646.1; 156/659.11
[58] Field of Search .................................... 430/313, 314, 430/315, 317, 323, 324, 325; 156/628, 643, 646, 659.1

[56] References Cited

U.S. PATENT DOCUMENTS

| | | | |
|---|---|---|---|
| 4,551,418 | 11/1985 | Hult et al. | 430/325. |
| 4,552,833 | 11/1985 | Ito et al. | 430/325 |
| 4,657,845 | 4/1987 | Frechet et al. | 430/326 |
| 4,957,588 | 9/1990 | Koshiba et al. | 156/628 |
| 5,085,729 | 2/1992 | Garza et al. | 156/628 |
| 5,094,936 | 3/1992 | Misium et al. | 430/325 |
| 5,116,715 | 5/1992 | Roland et al. | 430/191 |
| 5,139,925 | 8/1992 | Hartney | 430/326 |

OTHER PUBLICATIONS

*Solid State Technology*, "Desire: A New Route to Submicron Optical Lithography", by F. Coopmans et al., Jun. 1987, pp. 93–99.

*SPIE Advances in Resist Technology and Processing*, "Manufacturability Issues of the Desire process" by C. M. Garza et al., VII, vol. 1086, (1989), pp. 229–237.

*SPIE Advances in Resist Technology and Processing*, "Silylation of poly (t–BOC) styrene resists: Performance and Mechanisms", by C. A. Spence et al., vol. 1262. (1990) pp. 344–357.

*Journal of Vacuum Science and Technology*, "Silylation processes based on ultraviolet laser–induced crossinking", by M. A. Hartney et al., B8(6), (1990) pp. 1476–1480.

*ACS Symposium Series 412, Polymers in Microlithography*, "Evaluation of Several Organic Materials as Planarizing Layers for Lithographic and Etchback Processing", by L. E. Stillwagon et al., 1989, pp. 252–265.

*SPIE Advances in Resist Technology and Processing*, "Single Level Dry Developable Resist Systems, Based on Gas Phase Silylation", by J. P. W. Schellekens et al., VI (vol. 1086) pp. 220–228.

*SPIE X–Ray EUV Optics for Astromony, Microscopy, Polarimetry, and Projection Lithography*, "Resist schemes for soft x–ray lithography", by Gary N. Taylor et al., vol. 1343, (1990), pp. 258–273.

*Primary Examiner*—Kathleen Duda
*Attorney, Agent, or Firm*—Richard J. Botos

[57] ABSTRACT

A surface-imaging technique for lithographic processes is disclosed. The lithographic processes are used to manufacture integrated circuit devices. An image is produced on a resist that is applied onto a substrate. The image is produced by exposing selected regions of the resist material to radiation. The selected exposed regions correspond to the image. The resist is then exposed to a silylating reagent that selectively reacts with either the exposed or the unexposed region of the resist. The silylated resist is then subjected to reactive ion etching, which forms an in situ silicon oxide etch mask over the silylated regions of the resist. The mask so formed provides etching selectivity which provides precise image transfer from the resist into the substrate.

17 Claims, No Drawings

SURFACE-IMAGING TECHNIQUE FOR LITHOGRAPHIC PROCESSES FOR DEVICE FABRICATION

BACKGROUND OF THE INVENTION

1. Field of the Invention

This invention relates to the in situ formation of an etch mask by using silylating reagents in a lithographic process for device fabrication. The process employs surface-imaging techniques to obtain devices that satisfy fine design rules.

2. Art Background

Design rules for integrated circuit manufacture are becoming increasingly fine. Design rules of 0.5 µm are being replaced by design rules that are less than 0.5 µm. These increasingly fine design rules require processes which can transfer these features into the integrated circuit with concomitant accuracy.

Integrated circuits are manufactured using lithographic processes. A lithographic process employs energy that is introduced onto selected portions of an energy sensitive resist material overlying a substrate. Energy is introduced onto selected portions of the resist through openings in a mask substrate interposed between the energy source and the resist material. These openings in the mask substrate define the pattern. The pattern is transferred into the resist material by the energy that is permitted to pass through the openings in the mask substrate and into the resist. Thus, it is an image of the pattern defined by the mask substrate that is transferred into the resist material.

After the image is transferred into the resist material, the resist material is developed to form a pattern. The pattern is then transferred by etching into the substrate underlying the resist material. Once the pattern is incorporated into the substrate, it becomes a feature of the integrated circuit.

The energy used to expose the resist material, the composition of the resist material, the thickness of the resist material, and many other factors affect the ability of a lithographic process to delineate a feature in a substrate. The smaller the design rule, the more precisely the feature must be delineated.

Another factor which affects the ability of a process to define features in a substrate is the topography of the substrate surface. Substrate surface topography is either planar or non-planar. Non-planar surfaces are referred to as such because their surfaces are not in one single plane. When a resist material is applied over a non-planar substrate, the resist layer only approximately conforms to the non-planar substrate surface. As a result, the distance between the resist surface and the substrate surface tends to be nonuniform. This nonuniformity can adversely affect the pattern developed in a resist material because the depth at which the image is focused in the resist will also vary. If the depth of focus varies over the resist surface, the features resolved in the resist may not satisfy the applicable design rules.

Surface-imaging lithographic processes have been developed which do not require that the resist material be exposed throughout its entire thickness. These processes are referred to as surface-imaging processes because they define features only in the near-surface region of the resist. These surface-imaging resists are particularly useful in lithographic processes which normally define small features over a narrow range of focus. These processes utilize thinner exposed resist layers, have a broader focus range, and ultimately produce more highly resolved features than some processes that use resists that must be exposed throughout their entire thickness. Specifically, surface-imaged resists exhibit increased sensitivity and resolution as the effective resist thickness decreases from 0.5 µm to 0.1 µm depending on the incident radiation and other factors.

A surface-imaging lithographic process which incorporates refractory elements into portions of the resist layer to form an etch mask is described in F. Coopmans, et al. "DESIRE: A New Route to Submicron Optical Lithography", *Solid State Technology*, pp. 93–99 (June 1987). In the surface-imaging process described in this paper, a silylating reagent is introduced into the resist after it is exposed to radiation. Depending upon the changes in the resist caused by the exposure and subsequent processing, the silylating reagent is incorporated in either the exposed region or the unexposed region of the resist material. During plasma development, the silylating reagent forms an etching mask in the region into which it is incorporated. The silylating reagent, therefore, is used to impart a degree of etching resistance to the resist. The ratio of the etching rate in the region incorporating the reagent to the etching rate in the region intended to be substantially free of reagent is known as the etching selectivity. The region into which the silylating reagent is incorporated theoretically etches more slowly than the region into which the silylating reagent is not incorporated.

The resist material described in Coopmans, et al. is spin-deposited directly over a substrate with a non-planar (stepped) surface. An image is formed in the resist material by subjecting the resist material to a standard ultraviolet (UV) light exposure. The Coopmans', et al. article represents that a silicon-bearing compound such as hexamethyldisilazane (HMDS) is incorporated into the exposed portions of the Plasmask® resist material. Plasmask is a registered trademark of Union Chemie Belgique Corp. The article states that the so silylated Plasmask® is transformed into a silicon-containing image. The image is then incorporated into the substrate using oxygen plasma etching. The article states that the image in the Plasmask® is transformed into a silicon oxide mask because the silicon in the resist material binds with the active oxygen species and forms a loosely structured protective oxide that stops further etching while the other regions in the resist are etched away by an anisotropic reactive ion etching process. The process results in a negative tone relief image.

The process disclosed in C. Garza, et al., "Manufacturability issues of the DESIRE process", *SPIE Advances in Resist Technology and Processing*, VI 1086, pp. 229–237 (1989) is similar. The article states that a photoresist, a combination of novolac-resin/diazoquinone-sensitizer, was spin coated onto a substrate. The photoresist was then selectively exposed to energy. The article theorizes that the diazoquinone decomposed in the exposed region and that this brought about chemical changes in the resist that favored the incorporation of HMDS in these regions. Thus, when the resist was exposed to radiation, heated to crosslink unexposed regions, and then treated with a vapor containing HMDS, the HMDS was selectively incorporated into the exposed regions of the resist. The resist was then subjected to a dry etch, such as $O_2$ reactive ion etching. The article states that the etching rate for the area into which HMDS had not been incorporated, was faster than the etching rate for the area in which HMDS had been incorporated. An image corresponding to the negative of the image transferred into the resist was then transferred into the substrate. Garza et al., specify a preference for magnetically enhanced ion etching (MIE) to obtain acceptable resolution and focus latitude. The process described in Garza et al. leaves residues in the unsilylated regions after pattern development which are undesirable.

The surface-imaging process described in C. A. Spence, et al., "Silylation of poly(t-BOC) styrene resists: Performance and Mechanisms", *SPIE Advances in Resist Technology and Processing, VII*, 1262,, pp. 344–350 (1990). employs a single layer of resist material deposited over a substrate. The resist material so deposited is described as a copolymer of styrene and p-tert-butoxycarbonyloxystyrene. The resist described in the article was subjected to a patterned exposure. Upon heating the tert-butoxycarbonyl groups were cleaved from the resist material in the exposed region and replaced by hydrogen. According to the article, this cleavage produces phenolic sites on the polymer.

A silicon-containing material, HMDS, was introduced into the Spence et al. resist layer after the patterned exposure. The HMDS was preferentially absorbed by the polymer in the exposed region. Spence et al. state that this preferential absorption was caused by the presence of phenolic sites on the resist polymer. Spence et al. reported a negative image resulted when the resist so silylated was etched by oxygen (O$_2$)reactive ion etching.

M. A. Hartney, et al., "Silylation processes based on ultraviolet laser-induced crosslinking", *Journal of Vacuum Science and Technology*, B8(6), pp. 1476–1480 (1990) reports that a phenolic resin was spin-deposited onto a substrate. The exposed resin was then subjected to a patterned exposure. The resist material in the exposed region reportedly underwent crosslinking, while the resist material in the unexposed region reportedly did not. The resist material was then silylated. Dimethylsilyldimethylamine (DMSDMA) was used as the silylating reagent. The DMSDMA selectively diffused into the uncrosslinked regions of the resist material, and provided a positive-tone etch mask. The silylated resists were then etched in a parallel plate reactive ion etching system.

The purpose of the in situ etch masks described in the articles enumerated above is to impart etching selectivity between the exposed and unexposed regions of the resist material. The greater the etching selectivity, the better the resolution between the exposed and unexposed regions during development. In some of the processes described in the references that were previously discussed, adequate etch selectivity was not achieved. In Garza et al., residues were observed which indicates inadequate etch selectivity. Therefore, a surface-imaging process that provides better etch selectivity than the processes described above is desired.

SUMMARY OF THE INVENTION

A process for manufacturing integrated circuit devices is disclosed. In this process an imaging layer containing a polymeric resist material is deposited on a substrate. A latent image is transferred onto the imaging layer by exposing the imaging layer to radiation either by projection or by direct imaging at the resist surface. This "imagewise" exposure creates an image in the resist by exposing only certain portions of the resist layer to radiation. If a mask is used in the process, the mask defines the image that is transferred into the imaging layer. The unexposed and exposed regions of the imaging layer together define the latent image projected in the imaging layer. A refractory material is then introduced into the imaging layer. The refractory material is an organodisilane that is selectively permeable into one of either the exposed region or the unexposed region of the imaging layer, but not both. The organodisilane is characterized by the general formula:

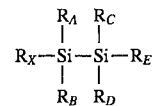

In the organodisilane, $R_X$ is a reactive group that is selectively cleaved from the disilane upon reaction with the polymeric resist material in either the exposed region or the unexposed region of the imaging layer. Exemplary $R_X$ groups include N,N-dimethylamino, N,N-diethylamino, N-methylamino, N-ethylamino, other amino groups, and azido, fluoro, chloro, bromo, iodo, cyano and thiocyano groups. Preferably, $R_X$ is N,N-dimethylamino or N-methylamino. The general formula is intended to describe the organodisilane and its substituents and is not intended to indicate any particular stereochemistry.

The selective silylation of the polymeric resist material is driven by the chemical and stereochemical relationships between the polymeric resist material and the organodisilane. Certain polymeric resist materials are chosen for the imaging layer to facilitate the silylation of the resist material. The selective silylation of the resist material is promoted if certain reactive groups are pendant to some portion of the polymers that make up the resist material. These reactive groups are pendant to the resist polymer in either the exposed or the unexposed region of the imaging layer. Alternatively, the reactive groups are pendant to the resist polymer in both the exposed and unexposed regions of the imaging layer. However, the imagewise exposure of the imaging layer causes the reactive groups in one of either the exposed or unexposed regions of the resist polymer, but not both, to be susceptible to reaction with the organodisilane. The imagewise exposure causes one region to be selectively susceptible to silylation by, for example, inducing a crosslinking reaction in the resist polymer in the exposed region of the imaging layer. The organodisilane cannot substantially diffuse into the crosslinked areas of the imaging layer. Thus, the organodisilane cannot substantially react with the resist polymer in the exposed region of the imaging layer.

The organodisilane silylates the resist polymer via any suitable mechanism that promotes attachment of the disilane group (—SiR$_A$R$_B$SiR$_C$R$_D$R$_E$) to the resist polymer in one of either the exposed or unexposed regions of the imaging layer. For example, the $R_X$ group, via a reaction with a reactive group pendant to the resist polymer that is susceptible to reaction as described above, creates a reactive site on the resist polymer. The disilane group binds to this reactive site so generated on the resist polymer. This reaction incorporates the larger disilane group into the polymer which causes the polymer to swell and which facilitates further diffusion of the silylating reagent into the desired region of the imaging layer.

The purpose of the selective silylation of the imaging layer is to form an etch mask in situ. The silylated portion of the resist layer will etch more slowly than the unsilylated portions. Thus, silylation introduces etching selectivity into the resist material. If the silylating agent does diffuse appreciably into both the exposed and unexposed regions of the resist, then the desired etching selectivity will not be achieved. If the desired etching selectivity is not achieved, the features of the integrated circuit produced will not be delineated.

Groups $R_{(A-E)}$ are either hydrogen (H) or methyl (CH$_3$) groups. Each of the $R_{(A-E)}$ groups in the organodisilane is either the same as or different from the other $R_{(A-E)}$ groups. Preferably at least two of the $R_{(A-E)}$ groups are $CH_3$ and the remaining $R_{(A-E)}$ groups are H.

Because this surface-imaging process is used to develop images in resists over non-planar as well as planar substrate surfaces, a planarizing layer is preferably deposited onto the substrate before the resist layer is deposited on the substrate. The planarizing layer is a thicker layer of hardened organic film or other suitable material. These materials include hardened positive photoresists. Examples of these photoresists include HPR-204, which is commercially obtained from OCG Microelectronics in Patterson, N.J., and SPR-1811 and SPR-513 which are commercially obtained from Shipley Co. in Newton, Mass. Hardened or cured planarizing coatings such as those discussed in Stillwagon, L. E. and Taylor, G. N., "Evaluation of Several Organic Materials as Planarizing Layers for Lithographic and Etchback Processing", *Polymers in Microlithography*, 412: 252–265 (ACS Symposium Series, 1989) are also acceptable materials for use as a planarizing layer. The planarizing layer is preferably crosslinked to a sufficient degree to prevent the silylating reagent from diffusing into this layer. If the silylating reagent diffuses into the planarizing layer to a significant extent and if it remains in the planarizing layer after the silylation step, then the etching selectivity between the silylated and unsilylated portions of the resist layer will be adversely affected.

DETAILED DESCRIPTION

The disclosed process utilizes surface-imaging techniques to produce an integrated circuit with submicron features. The process uses an etching mask which is formed in situ within the near surface portions of an imaging layer. The process introduces etching selectivity into the near surface portions of an imaging layer by incorporating a silylating reagent into certain regions of the imaging layer.

The imaging layer is deposited on top of a substrate, preferably a silicon substrate. The imaging layer is then exposed to radiation. Preferably, only selected portions of the imaging layer are exposed to radiation. The unexposed and exposed regions of the imaging layer together define a pattern.

The pattern is transferred onto the imaging layer in a number of ways. One way is by directing a beam of energy, such as electron beam energy, to only certain controlled portions of the imaging layer. Another is by interposing a mask substrate between an energy source, such as a light source, and the imaging layer. The patterned mask substrate defines a pattern. The energy passes through the openings in the mask substrate. The image defined by the mask substrate is, thus, transferred into the imaging layer. Only certain portions of the imaging layer are, thus, exposed to the radiation.

The imaging layer is made of a resist material. Radiation induces chemical changes in the resist material in the imaging layer. These chemical changes introduce a selectivity into the resist material. A silylating reagent that will selectively react with the resist material in one of either the exposed or unexposed regions, but not both, is introduced into the imaging layer. The silylating reagent preferentially reacts with the resist material in only one region. Due to this preferential reaction, the silylating reagent selectively diffuses into one of the exposed or unexposed regions of the resist material. This reaction and resulting diffusion cause the resist material in the affected region to swell. The coated substrate is then subjected to reactive ion etching, preferably $O_2$ reactive ion etching, which causes silicon oxides to form in the surface of the silylated resist material, thereby forming an etch mask in situ over the silylated portions of the resist material.

The mask so formed provides etching selectivity to the surface of the imaging layer. In this manner, fine features can be developed in the substrate. Since this process does not require the imaging layer to be exposed throughout its entire thickness, it is characterized as a surface-imaging process.

The imaging layer is deposited onto the substrate by any acceptable technique including, for example, spin-deposition. The substrate on which the imaging layer is so deposited has either a planar or a non-planar surface.

As mentioned previously, it is important that the image produced in the resist material be as free from linewidth variations and defects as possible. The possibility and degree of linewidth variations and other defects are reduced if the imaging layer has a more uniform, i.e. planar, surface. The quality of the image is also enhanced if energy that passes through the resist material does not reflect back into the resist material from the substrate.

If a planarizing layer is interposed between the substrate and the imaging layer, the surface of the imaging layer can be more planar. Non-planar substrate surfaces have many different high and low areas. When a layer of material, such as an imaging layer, is deposited over such a surface, it mainly conforms to that surface. This conformation, however, is inexact. The inexact conformation causes the thickness of the imaging layer deposited over the non-planar substrate surface to be non-uniform.

A planarizing layer deposited over the non-planar substrate surface provides a more planar surface on which to deposit the imaging layer. An imaging layer deposited over a planarizing layer tends to have a more uniform thickness than an imaging layer deposited directly over a non-planar substrate.

Uniformity, in this context, is a relative concept. The imaging layer should provide a uniform thickness for the exposing energy to pass through from all points on the surface of the imaging layer. A layer of uniform thickness and of minimum thickness provides for a maximum depth of focus. Depth of focus is actually a range of focus positions for a given resolution image in which the image meets all of the patterning specifications, e.g., wall profile, linewidth, aspect ratio and the like. By maximizing the depth of focus, the entire range of focus positions is more likely to be within the resist thickness. The planarizing layer provides for depositing a uniform imaging layer with a minimum thickness, which reduces the problems associated with variations in depth of focus.

Preferably, the planarizing layer is made of material that absorbs energy of the wavelength which is used to expose the resist. By absorbing energy of the exposure wavelength, the planarizing layer prevents an unwanted image from being transferred into the resist by energy that passed through the imaging layer, but was then reflected from the planarizing layer back up into the imaging layer. This unwanted reflection will provide defects in the pattern transferred from the imaging layer to the substrate.

For example, hardened novolac resins and positive resist materials are preferred materials for the planarizing layer when the energy to which the resist layer is exposed is at the 248 nm wavelength or wavelengths shorter than 248 nm. Radiation with a wavelength in the x-ray range, about 10 nm to about 20 nm is also contemplated as advantageous in the process of the present invention. Other materials that absorb light at a wavelength shorter than 248 nm are also therefore acceptable if the wavelength at which they absorb corresponds to the wavelength of the energy to which the imaging layer is exposed.

The planarizing layer preferably has an index of refraction that is substantially the same as the index of refraction of the imaging layer. This ensures that a minimum amount of energy that passes through the imaging layer will reflect back into the imaging layer at the interface between the imaging layer and the planarizing layer.

The planarizing layer preferably prevents the silylating reagent from diffusing into it. The planarizing material accomplishes this objective by providing either a physical barrier or a chemical barrier to the diffusion of the silylating reagent.

The planarizing layer preferably erects a physical barrier through which the silylating reagent cannot diffuse. An example of a planarizing layer material that, when crosslinked, forms an effective barrier through which the organodisilane cannot significantly diffuse is Shipley SPR-1811. This material provides an effective diffusion barrier when thermally hardened.

The planarizing layer also provides a chemical barrier through which the silylating reagent cannot readily diffuse. This barrier is also formed by crosslinking the planarizing material. However, planarizing materials that provide an effective barrier to the diffusion of the reagent, but which are not crosslinked, are also contemplated.

An uncrosslinked planarizing layer can act as a diffusion barrier by having certain properties. The organodisilanes, for example, diffuse more readily into a hydrophobic environment. Therefore, a hydrophilic planarizing layer will more readily act as a diffusion barrier than a hydrophobic planarizing layer (provided that the organodisilanes do not react with the hydrophobic layer). The rate at which the organodisilane diffuses into the planarizing layer is also dependent on the degree to which the organodisilane reacts with the resist. Consequently, a planarizing layer will provide an effective barrier to the diffusion of the organodisilane if it is a hydrophilic material that does not readily react with the organodisilane.

Whether of not the planarizing layer is crosslinked, the material used for the planarizing layer must have acceptable processing characteristics for use in a lithographic process. For example, the planarizing layer material must not significantly intermix with the above resist layer and must be compatible with processes used to transfer the pattern into the substrate. Also, the planarizing layer material must be thermally and mechanically stable at temperatures of up to about 200° C.

The resist material is a material which, when exposed to energy, undergoes a chemical change, creating differences between the exposed and unexposed resist material which can be exploited in a lithographic process. For example, the resist material is made of a polymer that crosslinks when exposed to the type of radiation used to transfer the pattern into the resist layer. Crosslinking is one example of mechanism employed to cause the organodisilane to diffuse selectively into either the exposed or unexposed regions of the imaging layer. Because of the stereochemical nature of the organodisilane, the organodisilane does not readily diffuse into the crosslinked regions of the imaging layer.

Diffusion of the organodisilane is promoted by the presence of reactive moieties that are pendant to the resist polymer. Examples of such reactive moieties include hydroxyl groups, imide groups, and sulfonamide groups that are pendant to the polymer backbone, or polymers in which these reactive moieties are pendant to substituents that are, in turn, pendant to the polymer backbone. These reactive moieties are either pendant in one of either the exposed or the unexposed regions of the imaging layer, or they are pendant to the resist polymer in both regions. Even if these moieties are present in both regions, however, they are susceptible to reactions with the organodisilane in only one region. This selective silylation is also promoted by a mechanism such as crosslinking the resist polymer as described above. Since the organodisilane cannot penetrate into the crosslinked areas of the imaging layer, it cannot react with the moieties pendant to the crosslinked polymer in the crosslinked region. Therefore, the imagewise exposure of the resist material introduces a selectivity into the resist material which facilitates selective silylation of the resist material.

Examples of suitable resist polymers include poly(vinyl alcohol) and its vinylacetate copolymers, poly(vinylphenol), poly(vinylmethylphenol)s, the cresol novolacs, poly(vinylresorcinol), poly(vinylcatechol), poly(vinylpyrogallol), resorcinol novolac, catechol novolac, the poly(vinylphenol)s, and the phenol novolacs.

Particularly advantageous resist polymers include a commercially obtainable resist material, Shipley XP 8844. This material is a proprietary composition of the Shipley Co. The composition is a mixture of a resist polymer, a crosslinking reagent, and a photoacid generator. The imaging layer has an absorbence of about 0.94 at a wavelength of 248 nm which is in the ultraviolet (UV) range, for a 1 μm thick film of this preferred resist polymer. An absorbence over the range of 0.1 to 2 per μm at a wavelength of 248 nm is contemplated. This material is a chemically amplified resist and is so termed because a number of chemical reactions are initiated by a single interaction between the energy source and the resist polymer.

The crosslinking reaction is either induced by acid that is generated by the resist material itself when exposed to radiation, or induced by a photoacid generator mixed into the resist material to generate the acid. The acid so generated initiates the crosslinking reaction. Examples of suitable photoacid generators include 2,6-dinitrobenzyl tosylate, brominated aromatic compounds, and onium salts such as di-(4-t-butylphenyl)iodonium trifluoromethane sulfonate. The imaging layer is optionally a non-chemically amplified resist such as phenolic resist materials containing azido moieties and no photoacid generators.

After exposure, the resist film is subjected to a post-exposure bake (PEB). The temperature at which the PEB occurs is below the temperature at which crosslinking of the resist in the unexposed areas would be induced. That temperature is below 150° C. Preferably, the PEB occurs at or below 130° C.

After the exposed resist material has been subjected to the post-exposure bake, the silylating reagent is introduced into the material. The silylating reagent is an organodisilane with the general structure:

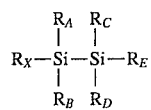

The silylating reagent is incorporated into either the exposed region or the unexposed region of the resist. One example of a reaction by which the silylating reagent is incorporated into the resist is illustrated by:

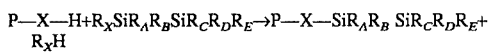

The resist polymer is represented as P—X—H. P is the polymer and X—H are moieties pendant to that polymer. $R_X$ reacts with the X—H moiety on the polymer. This reaction produces a reactive site, X, on the polymer to which the remaining portion of the silylating reagent, —$SiR_AR_BSiR_CR_DR_E$, binds. One example of a suitable XH moiety is OH, although other moieties which will react as described above are also contemplated.

$R_X$ in the silylating reagent is preferably N,N-dimethylamino, N,N-diethylamino, N-methylamino, N-ethylamino and other amino groups, and azido, fluoro, chloro, bromo, iodo, cyano and thiocyano groups. It is contemplated by this invention, however, that $R_X$ is any reactive group which can be attached to the disilane and which facilitates binding and diffusion of the silylating reagent into the resist material to form a suitable etch mask.

In the above formulation, each of the $R_{(A-E)}$ groups are the same or different. Each of the $R_{(A-E)}$ groups are either hydrogen (H) or alkyl, preferably methyl ($CH_3$), groups. Preferably at least two of the $R_{(A-E)}$ groups are methyl while the remainder are hydrogen.

The number of hydrogen and methyl groups on the organodisilane affects the properties of the organodisilane. Organodisilanes with fewer methyl groups are more reactive, incorporate more silicon into the polymer, and cause the polymer to swell less during silylation. Organodisilanes with more methyl groups are more stable. In this regard, it is contemplated that alkyl groups which are larger than methyl groups are also suitable substituents, provided that the resulting organodisilane has acceptable processing properties.

Examples of suitable silylating reagents include N,N-dimethylaminopentamethyldisilane, N-methylaminopentamethyldisilane, chloropentamethyldisilane, and N-N,dimethylaminodimethyldisilane. The preferred silylating reagent is N,N-dimethylaminopentamethyldisilane.

The organodisilane offers several advantages over silylating reagents previously used. The organodisilane contains two silicon atoms per molecule. This means that the silylating reagent contains more refractory material per molecule. Since the silylating reagent contains more refractory material per molecule, more refractory material is introduced into the areas of the resist material into which the silylating reagent permeates. The greater the amount of refractory material introduced into the silylated regions, the greater the etching selectivity between the silylated and unsilylated regions. Also, because of the size and shape of the organodisilane used in this process, it is less able to diffuse into crosslinked regions of the resist material. This makes crosslinking an effective mechanism to selectively silylate the imaging layer in a manner consistent with the image introduced into the imaging layer. The less the silylating reagent is able to diffuse into those regions in the resist material that are not intended to be silylated, the greater the etching selectivity between the silylated and unsilylated regions.

The silylating reagent is usually in a gaseous state when introduced into the resist material. However, the silylating reagent can also be applied in solution. For gaseous reactions the silylating temperature is about 70° C. to about 130°. Silylation occurs under a pressure that is less than atmospheric, preferably in the range of about 10 Torr to about 200 Torr. Preferably silylation occurs at a pressure of about 30 Torr. The silylating reagent is either introduced as a single gaseous species, or combined with another gas in which the partial pressure of the silylating reagent is about 0.2 to about 0.99 of the total pressure of the silylating atmosphere.

If the silylation occurs in solution, the solution is preferably primarily a nonsolvent for the resist material. A small amount of solvent for the resist material is included in the solution, however, to extract a small portion of the resist material from the imaging layer. By so extracting a small portion of the resist material, diffusion of the silylating reagent into the imaging layer is facilitated. When silylation takes place in solution, the solution temperature is preferably about 25° C.

As the silylating reagent is introduced into the resist material, the portions of the resist material into which the silylating reagent diffuses begin to swell. For a 0.28 μm thick layer, the volume of the silylated resist film has been observed to increase 60 percent or more over the volume of the unsilylated resist material using Shipley XP 8844 as the resist polymer and N,N-dimethylaminopentamethyldisilane as the silylating reagent. Preferably, this volume increase is manifested vertically and not laterally in the resist film. If the volume increases too much, it may lead to distortion of the latent image defined by the in situ mask. Therefore, controlling the volume increase is desirable.

The size of the organodisilane molecules, the amount of organodisilane introduced into the imaging layer, and the imaging layer thickness all affect the degree to which the imaging layer swells during silylation. The number of carbon atoms and the size of the organic substituents on the organodisilane therefore directly affect the degree to which the imaging layer swells during silylation. To reduce swelling, the number and the size of the carbon-containing substituents on the organodisilane are minimized.

After the resist material has been silylated, it is etched. Preferably, reactive ion etching is used to etch the silylated resist material. The reactive ion etching preferably takes place in a plasma that contains a reactive oxygen species. Gases from which such oxygen species can be produced include $NO_2$, $NO$, $CO_2$, $SO_3$, $SO_2$, $O_2$, and the like gases.

When the silylated film is subjected to such etching, the silylated portions of the resist film are oxidized, thereby forming in situ a silicon oxide mask on the silylated portions of the resist film. This mask etches about forty-five to about twenty-eight times more slowly than the unsilylated material depending upon the specific etch conditions. Such conditions include how the plasma is struck, etc. These differences in etch rates were observed when the unsilylated material was etched at rates of about 1.65 μm/min to about 1.2 μm/min, respectively. Etching occurs at temperatures of about −50° C. to about 50° C.

The following examples illustrate specific embodiments of the invention. These examples can be modified in many ways that fall within the scope of the present invention as defined by the claims. Such modifications are also within the scope of the present invention.

EXAMPLE 1

Preparation of Chloropentamethyldisilane

A three-necked, 2-liter, round-bottom flask with an overhead stirrer, thermometer, powder addition funnel, and a large diameter gas inlet/outlet was flame dried under an argon atmosphere. Hexamethyldisilane (198.1 g; 1.35 moles) and concentrated sulfuric acid (400 ml) were quickly added to the flask. The resulting mixture was vigorously stirred and gas evolution began immediately. The flask was cooled to maintain the temperature in the range of about 20° C. to 30° C. The gas evolution diminished after about three and one-half hours. The resulting mixture was observed to be homogeneous.

The mixture was then cooled to about 15° C. The powder addition funnel of the flask was charged with ammonium chloride powder (106 g; 1.98 moles). The ammonium chloride powder was added over the course of two hours. The resulting mixture was allowed to warm to room temperature while being stirred. This warming step took approximately 1 hour. Two layers formed and the top layer was separated from the bottom layer using a one liter separatory funnel maintained under an argon atmosphere. The top layer was then distilled at 120°–135° C. in a short path distillation apparatus. The resulting distillate was then more carefully distilled through a 30 cm Vigreux column. The product obtained (134.7 g; 0.808 moles) gave a 60% yield of chloropentamethyldisilane with a purity greater than 96%. The product was subjected to NMR testing and the results were $^1$H NMR (360 MHz, $C_6D_6$): δ 0.061, (s, 9H), 0.333 (s, 6H). $^1$H NMR for this and all other examples were taken using a Bruker 360 mhz NMR Spectrometer.

EXAMPLE 2

Preparation of N,N-Dimethylaminopentamethyldisilane

A 2-liter flask equipped with an overhead stirrer, thermometer, addition funnel, and a −78° C. condenser having a gas inlet was charged with 2.5M n-butyllithium (200 ml; 0.5 moles). The solution was cooled to −78° C. Anhydrous diethyl ether (800 ml) was then added to the solution. Anhydrous dimethylamine (136 g; 3 moles) was then condensed into the flask. Then chloropentamethyldisilane (110 g; 0.684 moles), dissolved in liquid pentane (200 ml) was added to the resulting suspension of lithium dimethylamide and diethylether via the addition funnel in the flask over a period of three hours.

The resulting mixture was allowed to warm to room temperature and stand overnight. The mixture was then filtered in a glove bag using a filter funnel having a sintered glass frit. The mixture was distilled to remove the solvents. The product (103 g; 0.588 moles) was obtained by distillation (boiling point of 150° C. to about 155° C.), for an 86% yield. The product obtained was N,N-dimethylaminopentamethyldisilane that was greater than 98% pure. The product was subjected to NMR testing and the results were $^1$H NMR (360 MHz, $CDCl_3$): δ 0.047, (s, 9H), 0.084 (s, 6H), 2.43 (s, 6H).

EXAMPLE 3

Preparation of N,N-Dimethylaminopentamethyldisilane

A dry 500 ml round-bottom flask equipped with a condenser, inlet, and septum was charged with hexamethyldisilane (7.03 g; 49.9 mmole) through the septum using a syringe. The flask was provided with an argon atmosphere via the inlet. Anhydrous trifluoromethanesulfonic (triflic) acid (5.8 ml; 7.7 g; 51 mmole) was added to the flask via the septum using a Teflon/glass syringe over a period of about 10 minutes.

Gas and heat evolved from the mixture, which was maintained at room temperature using a water bath and stirred for two hours. The resulting product was determined to be pentamethyldisilyl triflate from the NMR analysis for the product, $^1$H NMR (360 MHz, $CDCl_3$): δ 0.18 (s, 3H), 0.53 (s, 2H); C NMR (90 MHz, $CDCl_3$): δ −3.72, −0.62, 118.51 (q, $J_{CF}$=317 Hz), which was consistent for the structure of this compound. C NMR data were obtained using the same spectrometer as in Example 1.

Dry pentane (300 ml) was added to the product mixture via a cannula. The resulting solution was cooled to about 0° C. Anhydrous dimethylamine (15 g, 0.33 mole) was then bubbled into the solution using a needle. A white precipitate formed immediately. The mixture was then allowed to warm to room temperature after which the excess amine was vented. The mixture was then filtered through a sintered glass frit using a Schlenk line technique. The solvent in the mixture was removed by distillation. Another distillation was performed to obtain product (7.15 g; 40.7 mmole) for an 81% yield of N,N-dimethylaminopentamethyldisilane. The product was subjected to NMR testing and the results were $^1$H NMR (360 MHz, $CDCl_3$): δ 0.47 (s, 9H), 0.084 (s, 6H), 2.43 (s, 6H).

EXAMPLE 4

Preparation of N-Methylaminopentamethyldisilane

A 1-liter, round-bottom flask with a −78° C. condenser, powder addition funnel, and a gas inlet/outlet was flame dried under an argon atmosphere. Anhydrous methylamine (80 ml) was condensed into the flask. Diethyl ether (300 ml) was then added to the solution, which was then cooled to −78° C. Chloropentamethyldisilane (19.1 g; 0.114 moles) was mixed with an equal volume of anhydrous diethyl ether and the mixture was added to the flask via the addition funnel. The solution of chloropentamethyldisilane and ether was added to the solution in the flask over the course of one hour and a precipitate formed.

When the solution was warmed to room temperature, the excess methylamine gas was vented from the flask. The mixture was filtered using a Schlenk line technique and the solvent was removed from the mixture via distillation. Product (14.335 g; 89 mmole) was obtained by another distillation at about 146° to 147° C. to give a 78% yield. The product was N-methylaminopentamethyldisilane which was subjected to NMR testing. The results were $^1$H NMR (360 MHz, $C_6D_6$): δ 0.0951 (s, 9H), 0.121 (s, 6H) 2.37 (d, J=6.5 Hz, 3H); $^{13}$C NMR (90 MHz, $C_6D_6$): δ −2.15, −1.74, 28.48.

EXAMPLE 5

Lithography of a Resist Material Silylated According to the Disclosed Process A silicon wafer (5" diameter) was spin coated with SPR 1811 at a speed of 4000 rpm for 1 minute and then heated at 210° C. on a hot plate for 5 minutes. The resulting film was 1.1 μm thick. A second coating, a 1:1 mixture of XP-8844 obtained from the Shipley Co. and 2-ethoxyethyl acetate, was applied to the coated wafer by spinning at a speed of 2000 rpm for 2 minutes. The coated substrate was then heated at 100° C. for 2 minutes on a hot plate. A 0.28 μm thick film was formed on top of the previously coated and baked SPR-1811 layer. The two layers did not intermix. Their combined thickness was about 1.38 μm.

The resulting bilayer coated wafer was exposed at 248 nm using a 0.48 NA GCA XLS exposure tool. The exposure dose was 110 mJ/cm². The exposed wafer was baked at 125° C. for 2 minutes. The coated wafer was silylated with N,N-dimethylaminopentamethyldisilane vapor using a Model 150 Monarch, Inc. Universal Vacuum Processing Module at a temperature of 110° C. for 2 minutes at 30 Torr. The silylated coated wafer was then etched in a Lucas-Signatone, Inc. Model 5410 Vortex® helicon source etcher for 89 seconds at 2 mTorr, with an $O_2$ flow rate of 80 sccm, 1500 W of source power, and 120 W of chuck power while maintaining the backside wafer cooling at 25° C. Positive-tone 0.25 μm line and space features were resolved. The features had an aspect ratio of 5.4.

EXAMPLE 6

Lithography of a Resist Material Silylated According to the Disclosed Process In a manner similar to that in Example 5, a bilayer coated wafer was prepared and pattern-wise exposed at 248 nm with a dose of about 100 mJ/cm² using a 0.48 NA GCA XLS exposure tool as described in the previous example. The exposed wafer was heated at 130° C. for 2 minutes and then silylated with N-methylaminopentamethyldisilane for 2 minutes at 30 Torr and 110° C. The silylated bilayer coated wafer was etched under conditions described in Example 5 for 60 seconds to give positive tone 0.30 μm line and space features with an aspect ratio of 5.0.

EXAMPLE 7

Lithography of a Resist Material Silylated According to the Disclosed Process In a manner analogous to Example 5, a bilayer coated wafer was exposed at 193 nm with a 5 mm square spot produced by an ArF excimer laser. The exposed wafer was then heated at 125° C. for 2 minutes and subsequently silylated with a N,N-dimethylaminopentamethyldisilane vapor at 110° C. and 30 Torr for 2 minutes. Etching in an $O_2$ plasma for about 85 seconds gave positive tone images at a dose of 10 mJ/cm², a contrast of about 10 and a final thickness of 0.90 μm.

EXAMPLE 8

Lithography of a Resist Material Silylated According to the Disclosed Process In a manner analogous to Example 5, a bilayer coating was deposited on a silicon wafer (2" diameter). The first planarizing layer was a 0.52 μm thick layer of HPR-206 obtained from OCG Microelectronics. The planarizing layer was hardened as described in Example 5. A second 0.1 μm thick layer of XP-8844 was deposited over the planarizing layer. The bilayer coating was exposed to a 29 mJ/cm² incident dosage of 14 nm X-rays in a patternwise exposure. The exposure tool was an undulator attached to a UV synchrotron at the Brookhaven National Laboratory. The radiation was passed through a stencil mask and a Schwarzchild 20x reduction lens to patternwise expose the bilayer coating.

The exposed, bilayer-coated substrate was heated at 125° C. for two minutes on a hotplate under a vacuum. A silylation atmosphere of N,N-dimethylpentamethyldisilane at 100° C. and 30 Torr was introduced for two minutes. The pattern was developed by etching in a $Cl_2$ plasma for four seconds at 2 mTorr with a $Cl_2$ flow rate of 50 sccm at 25° C. using 2500 W of source of power and 25 W of chuck power. The pattern was further developed in an $O_2$ plasma for 28 seconds at 2.5 m Torr with an $O_2$ flow rate of 100 sccm at 25° C. The $O_2$ plasma was generated using 2500 W of source power and a 75 W of chuck power. Positive-tone 0.1 μm line and space features were resolved. The features had an aspect ratio of 6.

We claim:

1. A process for manufacturing a device comprising: depositing an imaging layer comprising a polymeric resist material on a substrate; exposing a portion of the imaging layer to radiation, thereby forming an exposed region and an unexposed region that together define an image of a pattern in the imaging layer; introducing into the imaging layer a refractory material comprising an organodisilane that is selectively permeable into one of either the exposed region or the unexposed region of the imaging layer, the refractory material characterized by the formula:

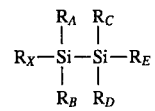

wherein $R_X$ is a reactive group that reacts with a functional group pendant to the polymeric resist material, the reaction producing a reactive site on the polymeric resist material with which the remaining portion of the refractory material, $-SiR_AR_BSiR_CR_DR_E$, reacts and groups $R_{(A-E)}$ are all selected from the group consisting of H and alkyl wherein $R_{(A-E)}$ are the same or different and wherein at least two of $R_{(A-E)}$ are alkyl; and developing the pattern in the imaging layer.

2. The process of claim 1 further comprising depositing a planarizing layer onto the substrate prior to depositing the imaging layer thereon.

3. The process of claim 2 wherein the planarizing layer so deposited absorbs radiation of the same wavelength as the wavelength of the radiation to which a portion of the imaging layer is exposed.

4. The process of claim 2 wherein the planarizing layer so deposited is not substantially permeable by the organodisilane.

5. The process according to claim 1 wherein the polymeric resist material in the exposed region has pendant functional groups that are susceptible to reaction in significant amounts with the $R_X$ group.

6. The process according to claim 1 wherein the polymeric resist material in the unexposed region has pendant functional groups that are susceptible to reaction in significant amounts with the $R_X$ group.

7. The process according to claim 1 wherein $R_X$ is selected from the group consisting of N,N-dimethylamino, N-methylamino, N,N-diethylamino, N-ethylamino, azido, fluoro, chloro, bromo, iodo, cyano and thiocyano.

8. The process of claim 1 wherein the alkyl groups are selected from the group consisting of ethyl and methyl.

9. The process of claim 1 wherein the alkyl groups are methyl groups.

10. The process of claim 1 wherein the image is developed by oxygen plasma etching in a plasma that comprises an oxygen species.

11. The process of claim 1 wherein the radiation which is used to expose the imaging layer has a wavelength in the ultraviolet range.

12. The process of claim 1 wherein the radiation which is used to expose the imaging layer has a wavelength in the x-ray range.

13. A process for manufacturing a device comprising: obtaining a substrate; depositing a planarizing layer comprising a polymeric resist material substrate; depositing an imaging layer comprising a polymeric resist material with pendant functional groups on the planarizing layer; exposing a portion of the imaging layer to radiation, thereby forming an exposed region and an unexposed region that together define an image of a pattern in the imaging layer; introducing into the imaging layer a refractory material comprising an organodisilane that is selectively permeable into one of either the exposed region or the unexposed region of the imaging layer, the refractory material characterized by the formula:

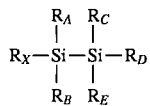

wherein $R_X$ is a reactive group that selectively reacts with the functional groups pendant to the polymeric resist material in one of either the exposed region or the unexposed region of the imaging layer, the reaction producing a reactive site with which the remaining portion of the refractory material, $SiR_A R_B SiR_C R_D R_E$, reacts, and groups $R_{(A-E)}$ are all selected from the group consisting of H and $CH_3$ wherein $R_{(A-E)}$ are the same of different and wherein at least two of $R_{(A-E)}$ are $CH_3$; and developing the pattern in the imaging layer.

14. The process according to claim 13 wherein the polymeric resist material in the exposed region has pendant functional groups that are susceptible to reaction in significant amounts with the organodisilane.

15. The process according to claim 13 wherein the polymeric resist material in the unexposed region has pendant functional groups that are susceptible to reaction in significant amounts with the organodisilane.

16. The process according to claim 13 wherein $R_1$ is selected from the group consisting of N,N-dimethylamino, N-methylamino, N,N-diethylamino, N-ethylamino, azido, fluoro, chloro, bromo, iodo, cyano, and thiocyano.

17. The process of claim 13 wherein the image is developed by etching in a plasma that comprises an oxygen species.

* * * * *